United States Patent
Wang

(10) Patent No.: US 11,817,862 B2
(45) Date of Patent: Nov. 14, 2023

(54) PULSE GENERATION CIRCUIT AND STAGGER PULSE GENERATION CIRCUIT

(71) Applicant: CHANGXIN MEMORY TECHNOLOGIES, INC., Hefei (CN)

(72) Inventor: Jia Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/665,734

(22) Filed: Feb. 7, 2022

(65) Prior Publication Data
US 2022/0294437 A1    Sep. 15, 2022

Related U.S. Application Data

(63) Continuation of application No. PCT/CN2021/112004, filed on Aug. 11, 2021.

(30) Foreign Application Priority Data

Mar. 9, 2021 (CN) .......................... 202110256942.6

(51) Int. Cl.
*H03K 5/00* (2006.01)
*H03K 5/1534* (2006.01)
(Continued)

(52) U.S. Cl.
CPC ......... *H03K 5/1534* (2013.01); *H03K 3/0315* (2013.01); *H03K 5/06* (2013.01); *H03K 5/13* (2013.01); *H03K 5/15* (2013.01)

(58) Field of Classification Search
CPC .. H03K 5/13; H03K 5/15; H03K 5/06; H03K 3/0315; H03K 5/1534
See application file for complete search history.

(56) References Cited

U.S. PATENT DOCUMENTS 5,418,485 A * 5/1995 Duret ..................... G06K 19/07
                                                    327/227
6,271,702 B1 * 8/2001 Stansell ..................... G06F 1/06
                                                    327/295
(Continued)

FOREIGN PATENT DOCUMENTS

| CN | 102148614 A | 8/2011 |
| CN | 207475510 U | 6/2018 |

(Continued)

*Primary Examiner* — Tuan T Lam
(74) *Attorney, Agent, or Firm* — Cooper Legal Group, LLC

(57) ABSTRACT

A pulse generation circuit and stagger pulse generation circuit are provided. The pulse generation circuit includes: an oscillation circuit that receives a control signal and generates a first oscillation signal according to the control signal; a period adjustment circuit that receives the first oscillation signal and a magnification selection signal and outputs a second oscillation signal, the period of the second oscillation signal is a period of the first oscillation signal or a period of an oscillation adjustment signal, and the second oscillation signal is selected according to the magnification selection signal; and a pulse conversion circuit that receives the second oscillation signal and outputs a pulse signal, the pulse of the pulse signal is generated according to the rising or falling edge of the second oscillation signal, and the pulse period of the pulse signal is the same as the oscillation period of the second oscillation signal.

20 Claims, 11 Drawing Sheets

(51) Int. Cl.
  *H03K 5/06* (2006.01)
  *H03K 3/03* (2006.01)
  *H03K 5/13* (2014.01)
  *H03K 5/15* (2006.01)

(56) References Cited

U.S. PATENT DOCUMENTS

| | | | |
|---|---|---|---|
| 7,629,828 B1* | 12/2009 | Nekl | G06F 1/08 |
| | | | 327/407 |
| 9,912,323 B1* | 3/2018 | Ardalan | H03K 5/135 |
| 10,763,831 B2 | 9/2020 | Akondy et al. | |
| 10,763,833 B2 | 9/2020 | Muellner et al. | |
| 2006/0044022 A1* | 3/2006 | Tayler | H03K 5/1534 |
| | | | 327/24 |
| 2010/0001777 A1* | 1/2010 | Brantley | H03L 7/0816 |
| | | | 327/261 |
| 2020/0177169 A1 | 6/2020 | Akondy et al. | |
| 2020/0212895 A1 | 7/2020 | Muellner et al. | |

FOREIGN PATENT DOCUMENTS

| | | | | |
|---|---|---|---|---|
| CN | 207801891 U | | 8/2018 | |
| CN | 109388882 A | | 2/2019 | |
| CN | 110995207 A | | 4/2020 | |
| CN | 111277252 A | | 6/2020 | |
| GB | 2375666 | * | 11/2002 | H03K 5/135 |

* cited by examiner

PULSE GENERATION CIRCUIT AND STAGGER PULSE GENERATION CIRCUIT

CROSS-REFERENCE TO RELATED APPLICATION

This application is a continuation application of International Patent Application No. PCT/CN2021/112004, filed on Aug. 11, 2021, which claims priority to Chinese Patent Application No. 202110256942.6, filed to the China National Intellectual Property Administration on Mar. 9, 2021 and entitled "PULSE GENERATION CIRCUIT AND STAGGER PULSE GENERATION CIRCUIT". The disclosures of International Patent Application No. PCT/CN2021/112004 and Chinese Patent Application No. 202110256942.6 are hereby incorporated by reference in their entireties.

BACKGROUND

In the design of semiconductor circuits, equidistant stagger signals are often used, and equidistant stagger signals refer to signals generated with a fixed delay every interval.

For synchronous signals, clock signals are usually used to generate equidistant stagger signals. For asynchronous signals, a delay cell is inserted to generate the required equidistant stagger signals. The delay between the signals can be achieved by inserting the corresponding delay cell as required. In the manner of using synchronous signals to generate equidistant stagger signals, the delay between equidistant stagger signals is an integer multiple of the clock period, and the controllability of the delay between equidistant stagger signals is poor. In the manner of using asynchronous signals to generate equidistant stagger signals, although the delay between the signals is controllable, the area of the formed circuit layout and the power consumption of the circuit will be significantly increased.

SUMMARY

This disclosure relates to but not limited to a pulse generation circuit and a stagger pulse generation circuit.

The embodiments of this disclosure provides a pulse generation circuit which includes: an oscillation circuit configured to receive a control signal and generate a first oscillation signal according to the control signal; a period adjustment circuit configured to receive the first oscillation signal and a magnification selection signal, and to output a second oscillation signal, herein the period of the second oscillation signal is a period of the first oscillation signal or a period of an oscillation adjustment signal, and the second oscillation signal is selected according to the magnification selection signal; and a pulse conversion circuit configured to receive the second oscillation signal and output a pulse signal, herein the pulse of the pulse signal is generated according to the rising edge or the falling edge of the second oscillation signal, and the pulse period of the pulse signal is the same as the oscillation period of the second oscillation signal.

DETAILED DESCRIPTION

In the manner of using synchronous signals to generate equidistant stagger signals, the delay between equidistant stagger signals must be an integer multiple of the clock period, and the controllability of the delay between equidistant stagger signals is poor. In the manner of using asynchronous signals to generate equidistant stagger signals, although the delay between the signals is controllable, the area of the formed circuit layout and the power consumption of the circuit will be significantly increased.

However, the applicant has found that the adjusting the signal delay of the equidistant stagger signals by the period of the pulse signal can reduce the area of the circuit layout and the power consumption of the circuit, and the delay between the signals does not need to be an integer multiple of the clock period, and thus, how to generate a pulse signal with a variable period is a prerequisite for optimizing the generation of the equidistant stagger signals.

In order to resolve the above problem, an embodiment of this disclosure provides a pulse generation circuit, which includes: an oscillation circuit configured to receive a control signal and generate a first oscillation signal according to the control signal; a period adjustment circuit configured to receive the first oscillation signal and a magnification selection signal, and to output a second oscillation signal, herein the period of the second oscillation signal is a period of the first oscillation signal or a period of an oscillation adjustment signal, and the second oscillation signal is selected according to the magnification selection signal; and a pulse conversion circuit configured to receive the second oscillation signal and output a pulse signal, herein the pulse of the pulse signal is generated according to the rising edge or the falling edge of the second oscillation signal, and the pulse period of the pulse signal and the oscillation period of the second oscillation signal are identical.

In order to make the objectives, technical solutions, and advantages of the embodiments of this disclosure clearer, the various embodiments of this disclosure will be described in detail below with reference to the accompanying drawings. However, those skilled in the art can understand that in each embodiment of this disclosure, many technical details are proposed for the reader to better understand this disclosure. However, even without these technical details and various changes and modifications based on the following embodiments, the technical solution claimed in this disclosure can also be realized. The following divisions of the various embodiments are for convenience of description, and should not constitute any limitation on the specific implementation of this disclosure, and the various embodiments may be combined with each other under the premise of no contradiction.

Figure 1:
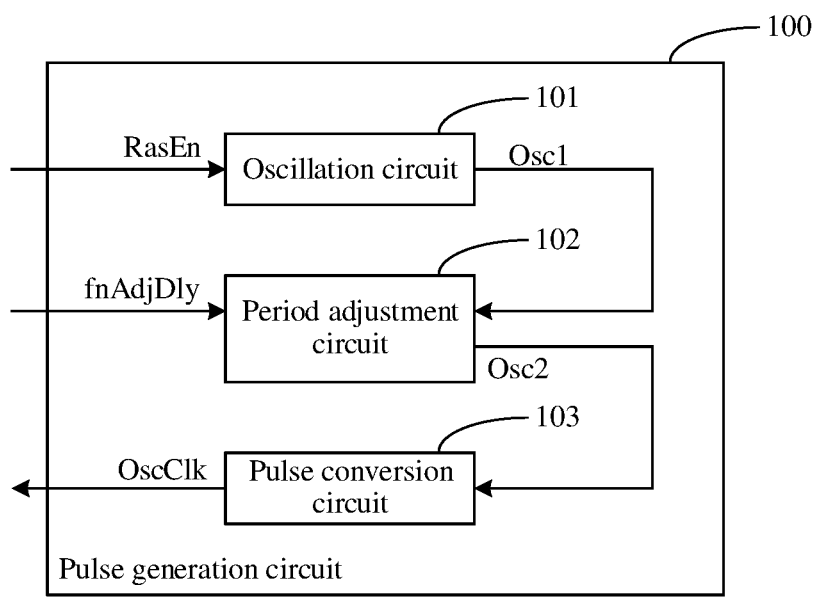
FIG. 1 and FIG. 2 illustrate structural schematic diagrams of a pulse generation circuit provided by an embodiment of this disclosure.
Figure 2:
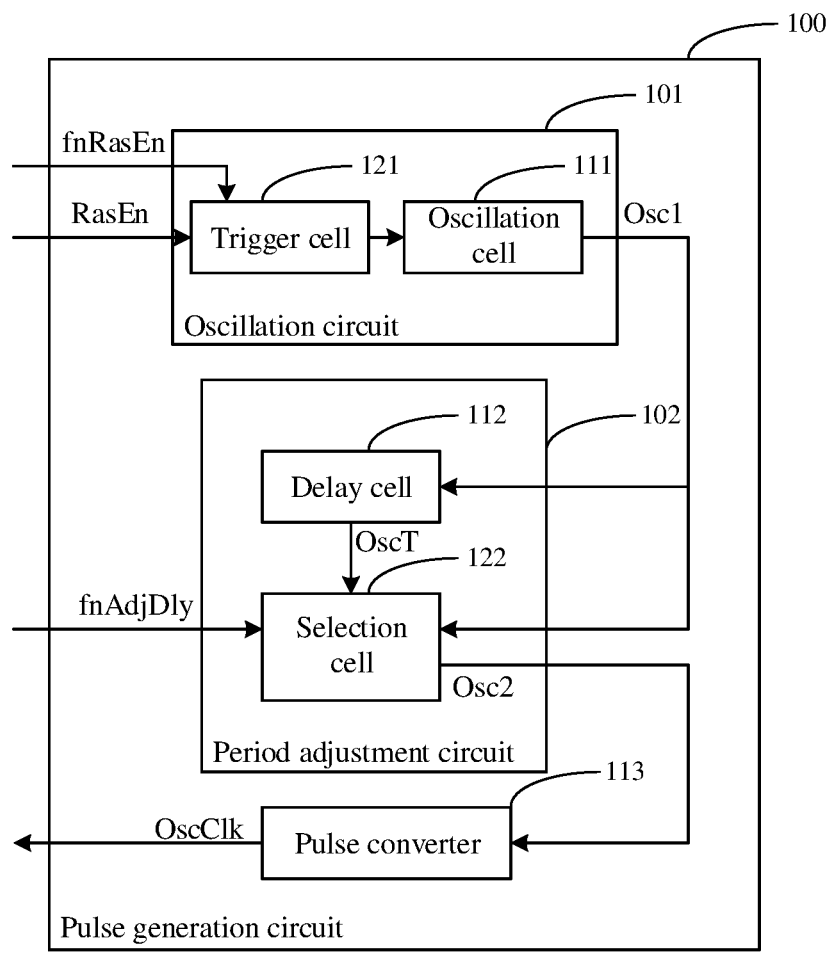
Figure 3:
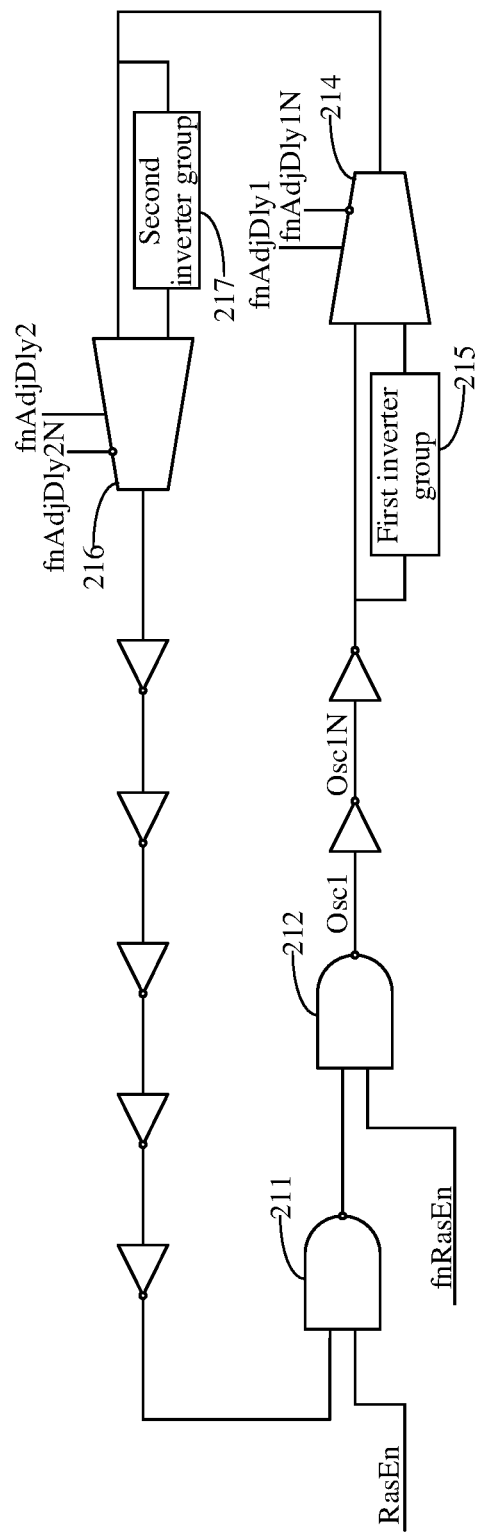
FIG. 3 illustrates a schematic diagram of a specific circuit of an oscillation circuit provided by an embodiment of this disclosure.
Figure 4:
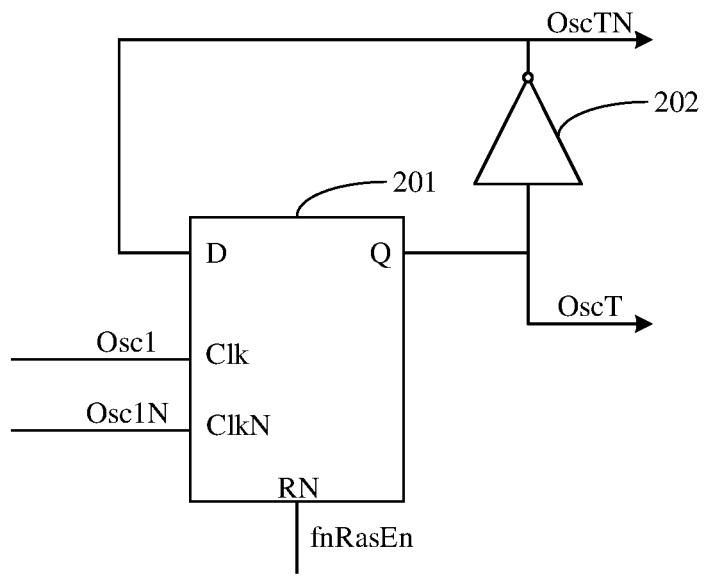
FIG. 4 illustrates a structural schematic diagram of a delay cell provided by an embodiment of this disclosure.
Figure 5:
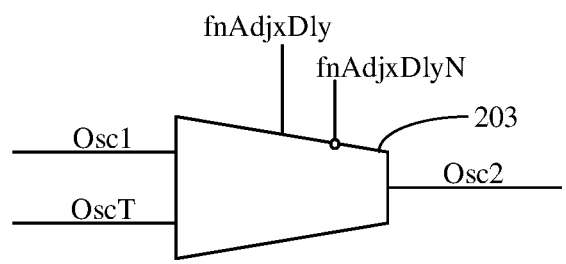
FIG. 5 illustrates a structural schematic diagram of a selection cell provided by an embodiment of this disclosure.
Figure 6:
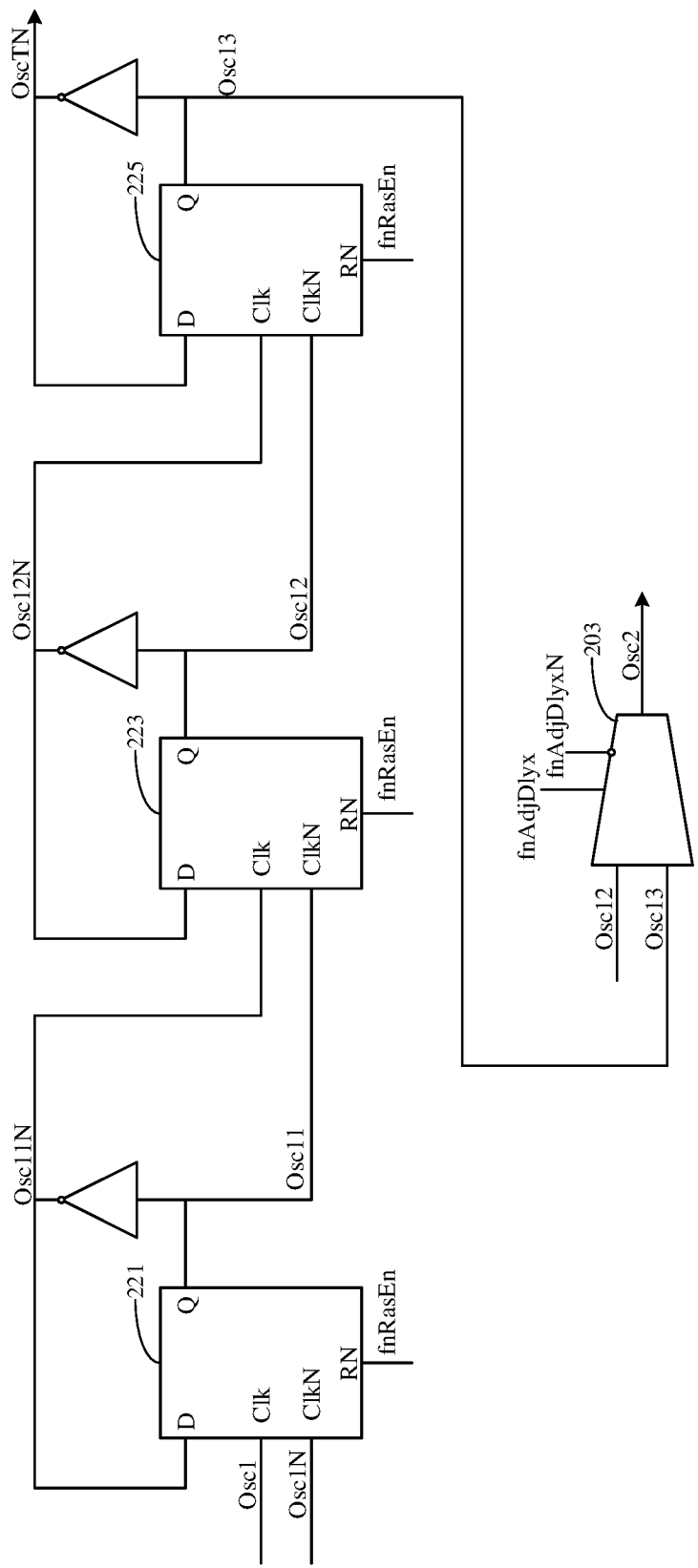
FIG. 6 and FIG. 7 illustrate schematic circuit diagrams of a period adjustment circuit provided by an embodiment of this disclosure.
Figure 7:
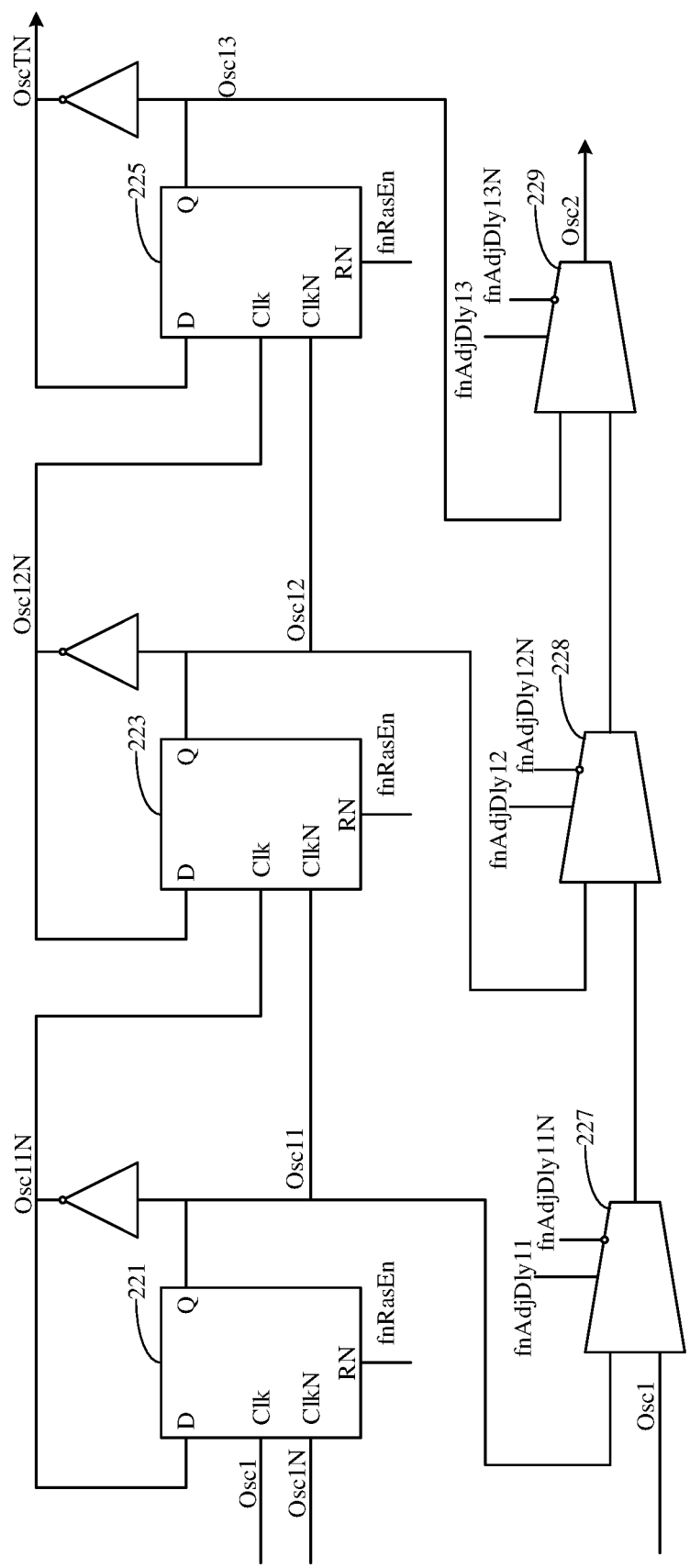
Figure 8:
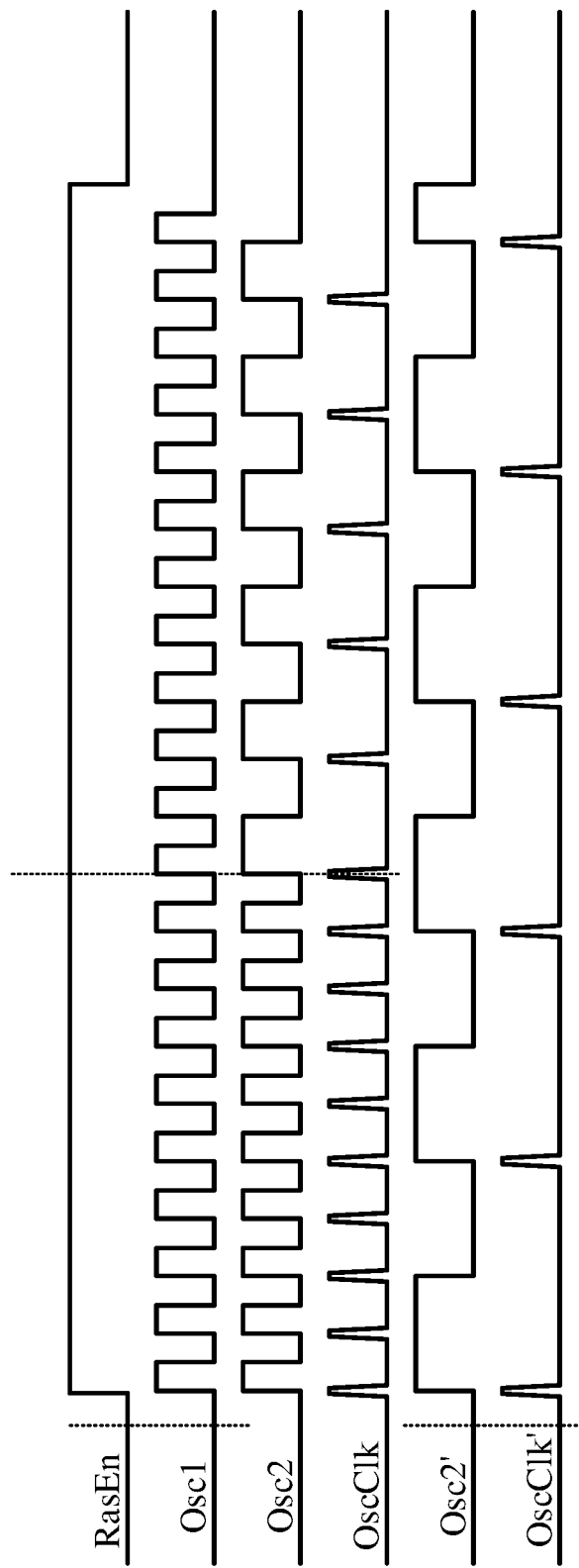
FIG. 8 illustrates a schematic timing diagram of signals in a pulse generation circuit provided by an embodiment of this disclosure.

FIG. 1 and FIG. 2 illustrate structural schematic diagrams of a pulse generation circuit provided by this embodiment, FIG. 3 illustrates a schematic diagram of a specific circuit of an oscillation circuit provided by this embodiment, FIG. 4 illustrates a structural schematic diagram of a delay cell provided by this embodiment, FIG. 5 illustrates a structural schematic diagram of a selection cell provided by this embodiment, FIG. 6 and FIG. 7 illustrate schematic circuit diagrams of a period adjustment circuit provided by this embodiment, FIG. 8 illustrates a schematic timing diagram of signals in a pulse generation circuit provided by this embodiment. The pulse generation circuit provided in this embodiment will be described in further detail below with reference to the accompanying drawings.

Referring to FIG. 1, a pulse generation circuit 100 includes an oscillation circuit 101 configured to receive a control signal RasEn and generate a first oscillation signal Osc1 according to the control signal RasEn.

The control signal RasEn is an external input command, and the oscillation circuit 101 is configured to generate the first oscillation signal Osc1 according to the external command Specifically, when the control signal RasEn is at an active level, the oscillation circuit 101 generates the first oscillation signal Osc1, and in this embodiment, supposing that the period of the first oscillation signal Osc1 is T.

In an example, when the control signal RasEn is received and the control signal RasEn is at an active level, the oscillation circuit 101 starts to oscillate to generate the first oscillation signal Osc1.

Furthermore, referring to FIG. 2, the oscillation circuit 101 includes: an oscillation cell 111 and a trigger cell 121 connected to the oscillation cell 111. The trigger cell 121 is configured to receive a reset signal fnRasEn and the control signal RasEn, and to trigger the oscillation cell 111 according to the reset signal fnRasEn and the control signal RasEn; after the oscillation cell 111 is triggered, the first oscillation signal Osc1 is generated according to the control signal RasEn.

It should be noted that in the expression "to trigger the oscillation cell 111 according to the reset signal fnRasEn and the control signal RasEn" described here, the meaning of "according to" includes but is not limited to: when the reset signal fnRasEn is in a non-reset state and the control signal RasEn is at the active level, the trigger cell 121 triggers the oscillation cell 111.

The reset signal fnRasEn is an external input reset command, configured to reset the trigger cell 121. Specifically, after the trigger cell 121 is reset, if the control signal RasEn received by the trigger cell 121 is at an active level, the trigger cell 121 triggers the oscillation cell 111, to able the oscillation cell 111 to generate the first oscillation signal Osc1.

In an example, referring to FIG. 3, the oscillation cell 111 includes a ring oscillator formed by A inverters connected in series, the A is a positive odd number, and A can be 5, 7, 9, 11, etc. In this embodiment, A=7, that is, a ring oscillator formed by 7 inverters connected in series is taken as an example for illustration, which does not constitute a limitation to this embodiment, and in specific applications, the number of inverters in the ring oscillator can be selected as actual required. The trigger cell 121 includes: a first NAND gate 211 and a second NAND gate 212. Herein the output terminal of the first NAND gate 211 is connected to an input terminal of the second NAND gate 212, an input terminal of the first NAND gate 211 and the output terminal of the second NAND gate 212 are configured to connect to the ring oscillator. One of the first NAND gate 211 and the second NAND gate 212 is configured to receive the control signal RasEn, and another one of the first NAND gate and the second NAND gate is configured to receive a reset signal fnRasEn. It should be noted that the first NAND gate 211 given in FIG. 3 being configured to receive the control signal RasEn, and the second NAND gate 212 configured to receive the reset signal fnRasEn does not constitute a limitation of this embodiment, and in other embodiments, the second NAND gate can also be configured to receive the control signal, and the first NAND gate can also be configured to receive the reset signal.

In this embodiment, the oscillation circuit 101 further includes: a first inverter group 215 that includes B inverters connected in series, B is a positive even number, and B can be 2, 4, 6, etc. In this embodiment, B=2, that is, the first inverter group 215 formed by two inverters connected in series is taken as an example for illustration, which does not constitute a limitation to this embodiment, and in specific applications, the number of inverters in the first inverter group 215 can be selected as actual required. A first selection cell (not illustrated) is configured to receive a first selection signal fnAdjDly1, and connect the first inverter group 215 in series between the adjacent inverters in the ring oscillator according to the first selection signal fnAdjDly1.

Specifically, the objective of the number of inverters in the first inverter group 215 being B is to ensure that the total number of inverters in the ring oscillator is an odd number. Specifically, the first selection cell (not illustrated) includes the first selector 214 configured to select the first branch or the second branch according to the first selection signal fnAdjDly1 and the inverted first selection signal fnAdjDly1N. Herein the first branch serves as a connection circuit between the adjacent inverters in the ring oscillator, the second branch connects the first inverter group 215 in series to the connection circuit of the adjacent inverters of the ring oscillator. The objective of connecting the first inverter group 215 to the ring oscillator is to increase the number of inverters in the ring oscillator so as to increase the period of the first oscillation signal Osc1 generated by the oscillation cell 111. In this embodiment, it is assumed that after the inverters of the first inverter group 215 are added, the generated first oscillation signal Osc1 is 1.2T. Since the operation that the first inverter group 215 is connected to the ring oscillator is controlled by the first selection signal fnAdjDly1, the period of the first oscillation signal Osc1 generated by the oscillation cell 111 can be adjusted by the first selection signal fnAdjDly1 input from the external.

In this embodiment, the oscillation circuit 101 further includes: a second inverter group 217 that includes C inverters connected in series, C is a positive even number, and C can be 2, 4, 6, etc. In this embodiment, C=4, that is, the second inverter group 217 formed by 4 inverters connected in series is taken as an example for illustration, which does not constitute a limitation to this embodiment, in a specific application, the number of inverters in the second inverter group 217 can be selected as actual required. A second selection cell (not illustrated) is configured to receive a second selection signal fnAdjDly2, and connect the second inverter group 217 in series between the adjacent inverters in the ring oscillator according to the second selection signal fnAdjDly2.

Specifically, the objective of the number of inverters in the second inverter group 217 being C is to ensure that the total number of inverters in the ring oscillator is an odd number. Specifically, the second selection cell (not illustrated) includes the second selector 216 that is configured to select the third branch or the fourth branch according to the second selection signal fnAdjDly2 and the inverted second selection signal fnAdjDly2N. Herein the third branch serves as a connection circuit between the adjacent inverters in the ring oscillator, and the fourth branch connects the second inverter group 217 in series to the connection circuit of the adjacent inverters of the ring oscillator. The objective of connecting the second inverter group 217 to the ring oscillator is to increase the number of inverters in the ring oscillator so as to increase the period of the first oscillation signal Osc1 generated by the oscillation cell 111. In this embodiment, it is assumed that after the inverters of the second inverter group 217 are added, the generated first oscillation signal Osc1 is 1.4T. Since the operation that the second inverter group 217 is connected to the ring oscillator is controlled by the second selection signal fnAdjDly2, the period of the first oscillation signal Osc1 generated by the oscillation cell 111 can be adjusted by the second selection signal fnAdjDly2 input from the external.

In this embodiment, B and C can be set to any positive even numbers. In specific applications, the values of B and C can be set reasonably according to the required change of the first oscillation signal Osc1 generated by the oscillation cell 111. In addition, in this embodiment, the implementations of two inverter groups are explained, and all of the implementation schemes of continuing to add the third inverter group and the fourth inverter group on the basis of this embodiment should fall within the protection scope of this disclosure.

Additionally, by simultaneously connecting the first inverter group 215 and the second inverter group 217 to the ring oscillator, the period of the first oscillation signal Osc1 changed with different amplitudes can be achieved. At this time, the period of the first oscillation signal Osc1 generated according to the combination of different first selection signal fnAdjDly1 and different second selection signal fnAdjDly2 is illustrated in the table 1:

TABLE 1

Period Table of Osc1

| fnAdjDly1 | fnAdjDly2 | Period of Osc1 |
| --- | --- | --- |
| 0 | 0 | T |
| 1 | 0 | 1.2T |
| 0 | 1 | 1.4T |
| 1 | 1 | 1.6T |

Continuing referring to FIG. 1, the pulse generation circuit 100 includes: a period adjustment circuit 102 configured to receive the first oscillation signal Osc1 and a magnification selection signal fnAdjDlyx, and to output a second oscillation signal Osc2. Herein the period of the second oscillation signal Osc2 is a period of the first oscillation signal Osc1 or a period of an oscillation adjustment signal OscT, and the second oscillation signal Osc2 is selected according to the magnification selection signal fnAdjDlyx, the magnification selection signal fnAdjDlyx is an external input selection command for adjusting the period of the second oscillation signal Osc2, that is, the pulse generation circuit can adjust the period of the second oscillation signal Osc2 generated by the period adjustment circuit 102 through the external input magnification selection signal fnAdjDlyx.

In one example, the first oscillation signal Osc1 can be used to generate the oscillation adjustment signal OscT, and then the first oscillation signal Osc1 may be selected as an output of the second oscillation signal Osc2 according to the magnification selection signal fnAdjDlyx; or the oscillation adjustment signal OscT may be selected as output of the second oscillation signal Osc2. Whether the oscillation adjustment signal OscT needs to be generated can also be determined according to the magnification selection signal fnAdjDlyx, that is, the second oscillation signal Osc2 is output in the manner of first determining and then generating.

Referring to FIG. 2, the period adjustment circuit 102 includes: a delay cell 112 and a selection cell 122. The delay cell is configured to receive the first oscillation signal Osc1, and to generate an oscillation adjustment signal OscT according to the first oscillation signal Osc1. Herein the period of the oscillation adjustment signal OscT is different from the period of the first oscillation signal Osc1. The selection cell 122 is configured to receive the magnification selection signal fnAdjDlyx and select the first oscillation signal Osc1 or the oscillation adjustment signal OscT as the second oscillation signal Osc2 according to the magnification selection signal fnAdjDlyx.

In one example, referring to FIG. 4, the delay cell 112 includes: a D flip-flop that includes an input terminal D, clock terminals Clk and ClkN, a reset terminal RN and an output terminal Q. The clock terminals Clk and ClkN are configured to receive the first oscillation signal Osc1 and the inverted first oscillation signal Osc1N. The reset terminal RN is configured to receive a reset signal fnRasEn. The output terminal Q is configured to trigger inverters 202 in series and connected to the input terminal D, and is configured to output the oscillation adjustment signal OscT. Those skilled in the art know that the period of the oscillation adjustment signal OscT output at this time is twice the period of the first oscillation signal Osc1.

Referring to FIG. 5, the selection cell 122 includes: a magnification selector 203 that includes a first selection input terminal, a second selection input terminal, a selection signal terminal and a selection output terminal. The first selection input terminal is configured to receive the first oscillation signal Osc1. The second selection input terminal is configured to receive the oscillation adjustment signal OscT. The selection signal terminal is configured to receive the magnification selection signal fnAdjDlyx and the inverted magnification selection signal fnAdjDlyxN. The selection output terminal is configured to output the second oscillation signal Osc2, and the period of the oscillation signal can be greatly changed by the magnification selection signal fnAdjDlyx.

At this time, the period of the second oscillation signal Osc2 generated according to different first selection signal fnAdjDly1, second selection signal fnAdjDly2, and magnification selection signal fnAdjDlyx is illustrated in Table 2:

TABLE 2

Period Table of Osc2

| fnAdjDlyx | fnAdjDly1 | fnAdjDly2 | Period of Osc2 |
| --- | --- | --- | --- |
| 0 | 0 | 0 | T |
| 0 | 1 | 0 | 1.2T |

TABLE 2-continued

Period Table of Osc2

| fnAdjDlyx | fnAdjDly1 | fnAdjDly2 | Period of Osc2 |
|---|---|---|---|
| 0 | 0 | 1 | 1.4T |
| 0 | 1 | 1 | 1.6T |
| 1 | 0 | 0 | 2T |
| 1 | 1 | 0 | 2.4T |
| 1 | 0 | 1 | 2.8T |
| 1 | 1 | 1 | 3.2T |

In this embodiment, the delay cell 112 includes E delay sub-cells connected in series, the oscillation adjustment signal OscT includes E delay signals, and the E is a positive integer. A first level delay sub-cell is configured to generate a first delay signal Osc11 according to the first oscillation signal Osc1, and input the first delay signal Osc11 into the second level delay sub-cell; A F-th level delay sub-cell is configured to generate an F-th delay signal Osc1F according to the (F−1)-th delay signal Osc1F−1, herein the F is a positive integer greater than or equal to 2 and less than or equal to the E.

Specifically, the F-th level delay sub-cell includes a D flip-flop that includes an input terminal, a clock terminal, a reset terminal, and an output terminal. The clock terminal is configured to receive the (F−1)-th delay signal Osc1F−1 and the inverted (F−1)-th delay signal Osc1F−1N. The reset terminal is configured to receive a reset signal. The output terminal is configured to trigger inverters in series and connected to the input terminal, and is configured to output the F-th delay signal Osc1F. Those skilled in the art can know that the period of the F-th delay signal Osc1F output at this time is twice the period of the (F−1)-th delay signal Osc1F−1.

Referring to FIG. 6, the delay cell 112 includes three delay sub-cells connected in series, namely, the first level delay sub-cell 221, the second level delay sub-cell 223, and the third level delay sub-cell 225. The first level delay sub-cell 221 is configured to generate a first delay signal Osc11 according to the first oscillation signal Osc1, and the period of the first delay signal Osc11 is twice the period of the first oscillation signal Osc1. The second level delay sub-cell 223 is configured to generate a second delay signal Osc12 according to the first delay signal Osc11, and the period of the second delay signal Osc12 is twice the period of the first delay signal Osc11. The third level delay sub-cell 225 is configured to generate a third delay signal Osc13 according to the second delay signal Osc12, and the period of the third delay signal Osc13 is twice the period of the second delay signal Osc12.

In one example, the selection cell 122 selects the first oscillation signal Osc1 or the oscillation adjustment signal OscT as the second oscillation signal Osc2 according to the magnification selection signal fnAdjDlyx, which includes: selecting the (E−1)-th delay signal Osc1E−1 or the E-th delay signal Osc1E as the second oscillation signal Osc2 according to the magnification selection signal fnAdjDlyx.

In this embodiment, the selection cell 122 selects the first oscillation signal Osc1 or the oscillation adjustment signal OscT as the second oscillation signal Osc2 according to the magnification selection signal fnAdjDlyx, which includes: selecting the second delay signal Osc12 or the third delay signal Osc13 as the second oscillation signal Osc2 according to the magnification selection signal fnAdjDlyx. The first level delay sub-cell 221 and the second level delay sub-cell 223 are configured to expand the period of the output second oscillation signal Osc2.

At this time, the period of the second oscillation signal Osc2 generated according to different first selection signal fnAdjDly1, second selection signal fnAdjDly2, and magnification selection signal fnAdjDlyx is illustrated in Table 3:

TABLE 3

Period Table of Osc2

| fnAdjDlyx | fnAdjDly1 | fnAdjDly2 | Period of Osc2 |
|---|---|---|---|
| 0 | 0 | 0 | 4T |
| 0 | 1 | 0 | 4.8T |
| 0 | 0 | 1 | 5.6T |
| 0 | 1 | 1 | 6.4T |
| 1 | 0 | 0 | 8T |
| 1 | 1 | 0 | 9.6T |
| 1 | 0 | 1 | 11.2T |
| 1 | 1 | 1 | 12.8T |

In another example, the selection cell 122 includes E selection sub-cells connected in series, and the magnification selection signal fnAdjDlyx includes a sub-magnification selection signal corresponding to each selection sub-cell. A first level selection sub-cell is configured to select a first oscillation signal Osc1 or a first delay signal Osc11 to input into a second level selection sub-cell according to a corresponding sub-magnification selection signal. A F-th level selection sub-cell is configured to select an output signal of the (F−1)-th level selection sub-cell or the F-th delay signal Osc1F to input into the (F+1)-th level selection sub-cell according to a corresponding sub-magnification selection signal. An E-level selection sub-cell is configured to select an output signal of the (E−1)-th level selection sub-cell or the oscillation adjustment signal OscT as the second oscillation signal according to a corresponding sub-magnification selection signal, herein the F is a positive integer greater than or equal to 2 and less than the E.

Specifically, the F-th level selection sub-cell includes: a magnification selector that includes a first selection input terminal, a second selection input terminal, a selection signal terminal, and a selection output terminal. The first selection terminal is configured to receive an output signal of the (F−1)-th level selection sub-cell. The second selection input terminal is configured to receive the F-th delay signal Osc1F. The selection signal terminal is configured to receive a corresponding sub-magnification selection signal. The selection output terminal is configured to output an output signal of the (F−1)-th level selection sub-cell or the F-th delay signal Osc1F.

Referring to FIG. 7, the selection cell 122 includes three selection sub-cells connected in series, namely, the first level selection sub-cell 227, the second level selection sub-cell 228, and the third level selection sub-cell 229. The first level selection sub-cell 227 is configured to select the first oscillation signal Osc1 or the first delay signal Osc11 to be input to the second level selection sub-cell 228. The second level selection sub-cell 228 is configured to select the output signal of the first level selection sub-cell 227 or the second delay signal Osc12 to be input to the third level selection sub-cell 229. The third level selection sub-cell 229 is configured to select the output signal of the second level selection sub-cell 228 or the third delay signal Osc13 as the oscillation adjustment signal OscT. Through the series connection of multiple selection sub-cells, more selection of changes in the period of the second oscillation signal Osc2 is achieved.

It should be noted that in the specific application process, the magnification selection signal fnAdjDlyx, the first selection signal fnAdjDly1, and the second selection signal fnAdjDly2 can be achieved by a multi-bit binary number, that is, the selection signal is a multi-bit binary number, one bit of which is used as the magnification selection signal fnAdjDlyx, one bit of which is used as the first selection signal fnAdjDly1, and one bit of which is used as the second selection signal fnAdjDly2.

Continuing referring to FIG. 1, the pulse generation circuit 100 includes: a pulse conversion circuit 103 that receives the second oscillation signal Osc2 and outputs a pulse signal OscClk. The pulse of the pulse signal OscClk is generated according to the rising edge or the falling edge of the second oscillation signal, and the pulse period of the pulse signal OscClk is the same as the oscillation period of the second oscillation signal.

Specifically, referring to FIG. 2, the pulse conversion circuit 103 includes: a pulse converter 113 configured to receive the second oscillation signal Osc2 and to generate the pulse signal OscClk according to the second oscillation signal Osc2.

In an example, when the pulse converter 113 detects the rising edge of the second oscillation signal Osc2, the pulse converter 113 outputs an upward narrow pulse, and the output terminal of the pulse converter 113 can also output a downward narrow pulse by connecting a inverter in series. In another example, when the pulse converter 113 detects the rising edge of the second oscillation signal Osc2, the pulse converter 113 outputs a downward narrow pulse, the output terminal of the pulse converter 113 can also output a upward narrow pulse by connecting a inverter in series. In addition, in this embodiment, the pulse converter 113 operates according to the rising edge of the second oscillation signal Osc2, and in other embodiments, the pulse converter may also operate according to the falling edge of the second oscillation signal.

It should be noted that in the "to generate pulse signal OscClk according to the second oscillation signal Osc2" described here, the meaning of "according to" includes but is not limited to: after detecting the rising edge of the second oscillation signal Osc2, or detecting that the second oscillation signal Osc2 changes from a low level to a high level (or from a high level to a low level), a narrow pulse of the pulse signal OscClk is generated.

It should be noted that in this embodiment, the pulse signal OscClk is generated according to the rising edge of the second oscillation signal Osc2. In other embodiments, the pulse signal may also be generated according to the falling edge of the second oscillation signal.

Referring to FIG. 8, during the control signal RasEn being at an active level, the oscillation circuit 101 generates a first oscillation signal Osc1 with a period of T, and the period adjustment circuit 102 adjusts the period of the second oscillation signal Osc2 (Osc2') according to the magnification selection signal fnAdjDlyx.

Specifically, if the magnification selection signal fnAdjDlyx is changed during the control signal RasEn being at the active level, the period of the second oscillation signal Osc2 generated at this time has a change. Assuming that the period T changes to a period 2T, the pulse period of the pulse signal OscClk generated at this time also changes from period T to period 2T. If the magnification selection signal fnAdjDlyx is changed before the control signal RasEn becomes an active level, the period of the second oscillation signal Osc2' generated at this time has no change, and the pulse period of the generated pulse signal OscClk' also has no change.

Compared with the related art, the first oscillation signal is generated according to the control signal, that is, when the control signal is at the active level, the first oscillation signal with a certain period is generated; the second oscillation signal is generated based on the first oscillation signal according to the magnification selection signal, that is, the period of the first oscillation signal is changed according to the magnification selection signal to generate a corresponding second oscillation signal; and then, the second oscillation signal is used as a signal source to generate a pulse signal, and the pulse period of the generated pulse signal is the same as the oscillation period of the second oscillation signal. In the process of generating the pulse signal, if the magnification selection signal changes, the amplitude of the period of the first oscillation signal is adjusted to change the period of the generated second oscillation signal, so as to generate a pulse signal with adjustable period.

It is worth mentioning that each cell involved in this embodiment is a logical cell. In practical applications, a logical cell can be a physical cell, a part of a physical cell, or can also be achieved as a combination of multiple physical cells. In addition, in order to highlight the innovative part of this disclosure, this embodiment does not introduce cells that are not closely related to solving the technical problem proposed by this disclosure, but this does not indicate that there are no other cells in this embodiment.

Another embodiment of this disclosure relates to a stagger pulse generation circuit, which includes: a signal generation circuit, a first pulse generation cell and a second pulse generation cell. The signal generation circuit is configured to generate a first control signal and a second control signal according to an activation signal, herein the first control signal and the second control signal are inverted signals. The first pulse generation cell includes the above pulse generation circuit and is configured to generate a first pulse signal according to the first control signal. The second pulse generation cell includes the above pulse generation circuit and is configured to generate a second pulse signal according to the second control signal. Herein the first pulse signal and the second pulse signal are stagger pulse signal.

Figure 9:
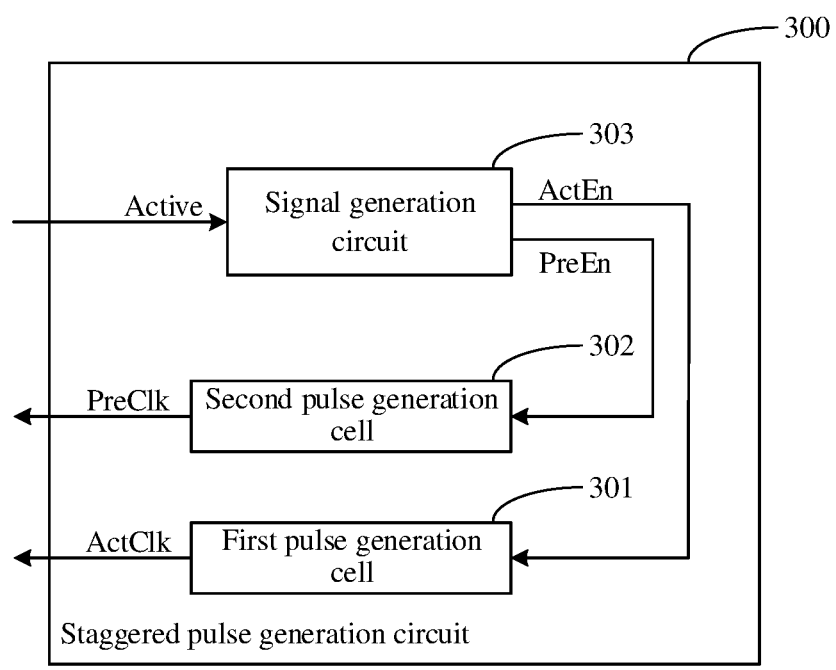
FIG. 9 and FIG. 10 illustrate structural schematic diagrams of a stagger pulse generation circuit provided by another embodiment of this disclosure.
Figure 10:
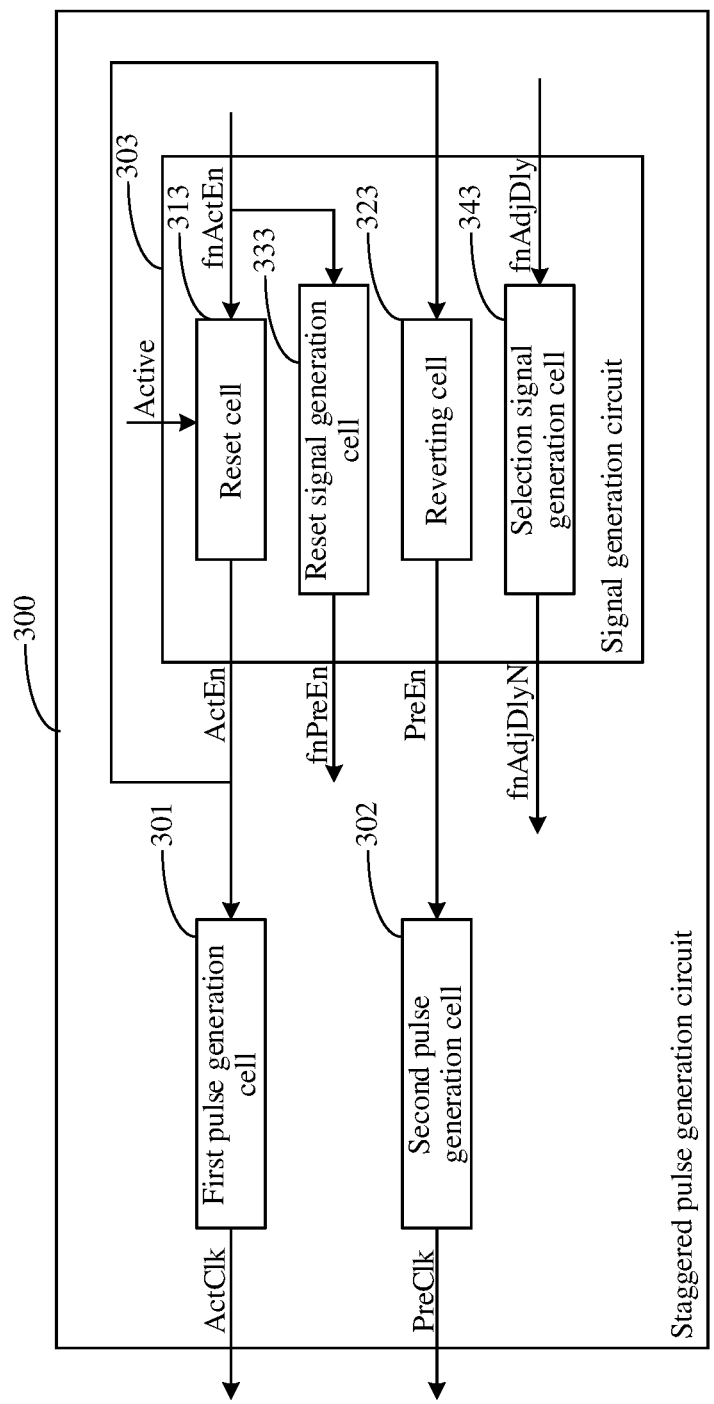
Figure 11:
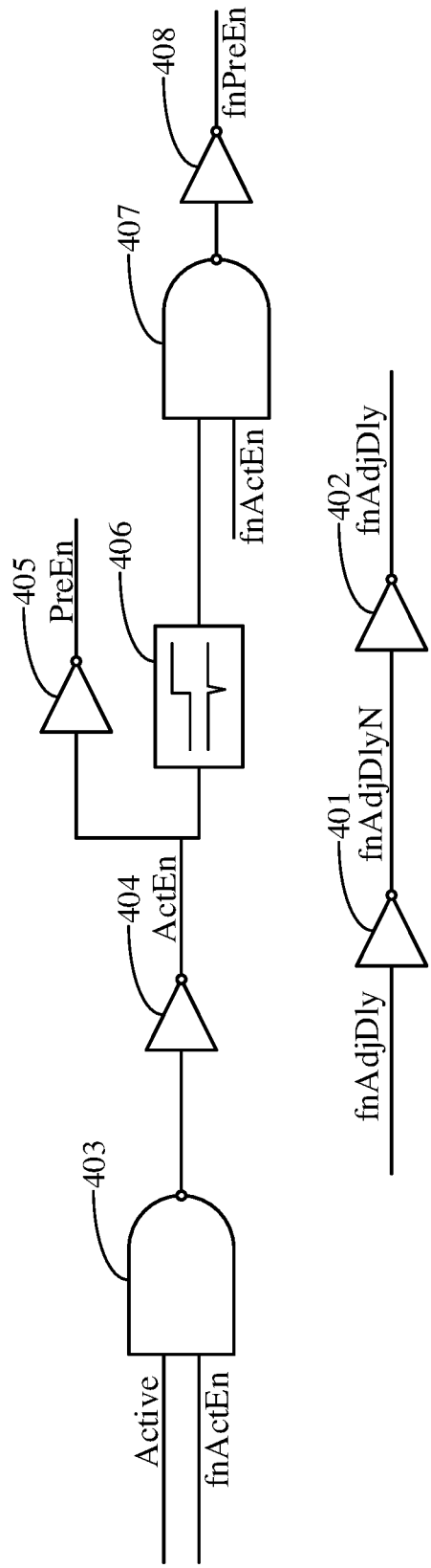
FIG. 11 illustrates a schematic diagram of a specific circuit of a signal generation circuit provided by another embodiment of this disclosure.
Figure 12:
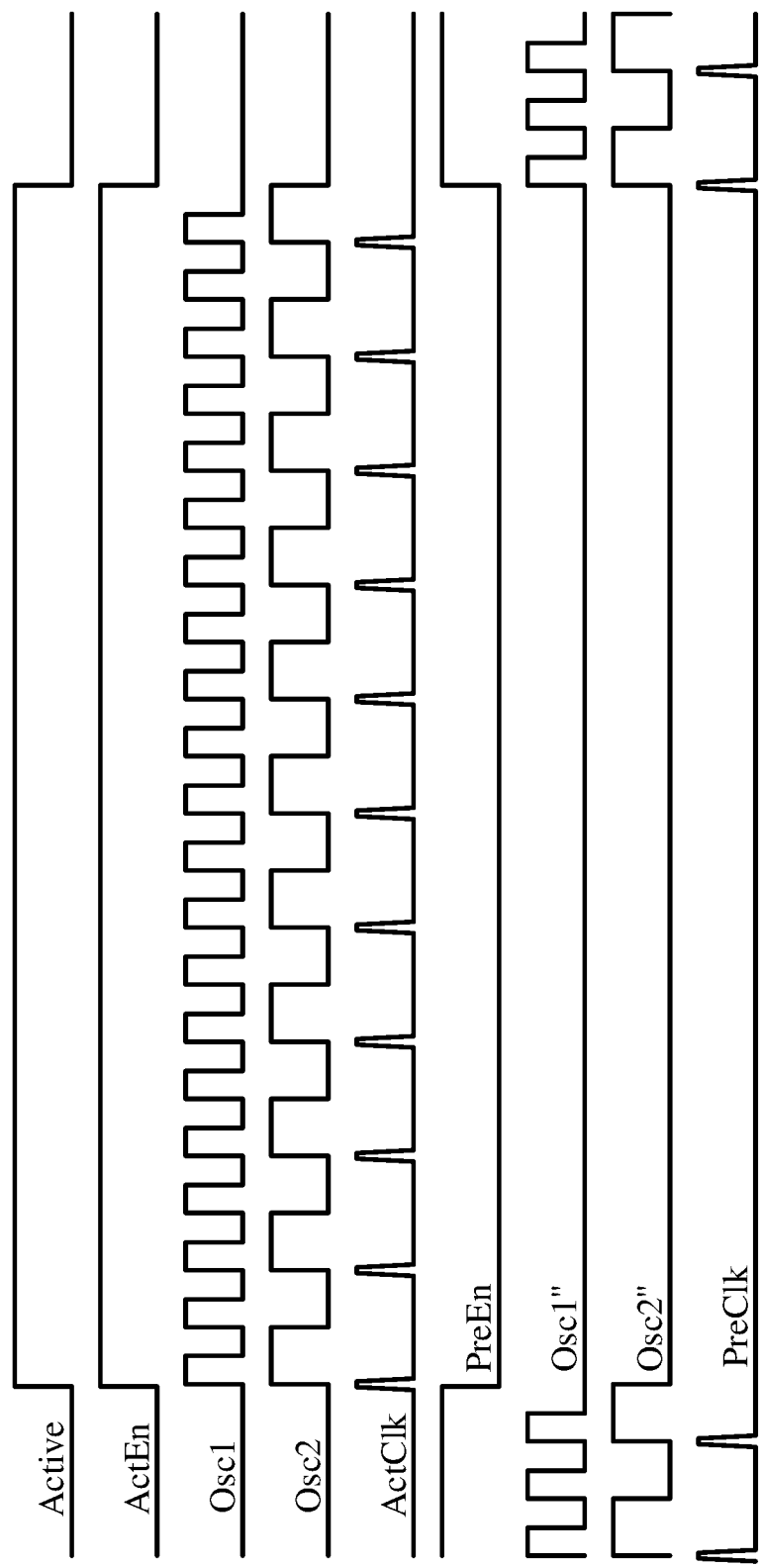
FIG. 12 illustrates a schematic timing diagram of signals in the stagger pulse generation circuit provided by another embodiment of this disclosure.

FIG. 9 and FIG. 10 illustrate structural schematic diagrams of a stagger pulse generation circuit provided by this embodiment. FIG. 11 illustrates a schematic diagram of a specific circuit of a signal generation circuit provided by this embodiment. FIG. 12 illustrates a schematic timing diagram of signals in the stagger pulse generation circuit provided by this embodiment. The stagger pulse generation circuit provided in this embodiment will be described in detail below in combination with the accompanying drawings, the parts that are the same as or corresponding to the above embodiment will not be described in detail below.

Referring to FIG. 9, a stagger pulse generation circuit 300 includes: a signal generation circuit 303 configured to generate a first control signal ActEn and a second control signal PreEn according to an activation signal Active, the first control signal ActEn and the second control signal PreEn are inverted signals. Herein, the activation signal Active is an external input activation command, and the signal generation circuit 303 is configured to generate a first control signal ActEn and a second control signal PreEn that are mutually inverted signals according to the external activation command.

Specifically, referring to FIG. 10, the signal generation circuit 303 includes a reset cell 313 and a reverse cell 323:

A reset cell 313 receives a first reset signal fnActEn and the activation signal Active, and generates the first control signal ActEn according to the first reset signal fnActEn and the activation signal Active.

The first reset signal fnActEn is an external input reset command for resetting the reset cell 313. Specifically, after the reset cell 313 is reset, if the activation signal Active received by the reset cell 313 is at an active level, the reset cell 313 generates the first control signal ActEn.

A reverse cell 323 receives the first control signal ActEn, and generates the second control signal PreEn according to the first control signal ActEn.

In this embodiment, the signal generation circuit 303 further includes: a reset signal generation cell 333 configured to generate a second reset signal fnPreEn according to the first reset signal fnActEn and the first control signal ActEn, so that the second reset signal fnPreEn is also in a reset state when the first reset signal fnActEn is in the reset state, or the second reset signal fnPreEn with a reset narrow pulse is generated according to the changing edge of the first control signal ActEn when the first reset signal fnActEn is in a non-reset state.

In this embodiment, the signal generation circuit 303 further includes: a selection signal generation cell 343 configured to receive a selection signal fnAdjDly and generate a selection signal group according to the selection signal fnAdjDly, the selection signal group includes the selection signal fnAdjDly and an inverted selection signal fnAdjDlyN, and the selection signal fnAdjDly and the inverted selection signal fnAdjDlyN are inverted signals.

It should be noted that in this embodiment, the selection signal fnAdjDly includes a magnification selection signal fnAdjDlyx, a first selection signal fnAdjDly1, and a second selection signal fnAdjDly2 for regulating the pulse generation circuit 100.

In one example, referring to FIG. 11, the reset cell 313 includes: a reset NAND gate 403 and a reset inverter 404, the reset inverter 404 is connected to the output terminal of the reset NAND gate 403, and the reset NAND gate 403 is configured to receive the first reset signal fnActEn and the activation signal Active.

The reverse cell 323 includes an output inverter 405 connected to the reset cell 313, and is configured to generate a second control signal PreEn according to the first control signal ActEn.

The reset signal generation cell 333 includes: a pulse conversion device 406 configured to detect a changing edge (such as a rising edge) of the first control signal ActEn to generate a pulse control signal; an output NAND gate 407 and an output inverter 408, herein the output NAND gate 407 is also configured to receive the first reset signal fnActEn, and at this time, the output inverter 408 outputs the second reset signal fnPreEn.

The selection signal generation cell 343 includes: a first selection inverter 401 and a second selection inverter 402 connected in series; and the output terminal of the first selection inverter 401 is connected to the input terminal of the second selection inverter 402, for generating a selection signal group according to the selection signal fnAdjDly.

Continuing referring to FIG. 9, the stagger pulse generation circuit 300 further includes: a first pulse generation cell 301 and a second pulse generation cell 302. The first pulse generation cell 301 includes the above pulse generation circuit 100 and is configured to generate the first pulse signal ActClk according to the first control signal ActEn. The second pulse generation cell 302 includes the above pulse generation circuit 100 and is configured to generate the second pulse signal PreClk according to the second control signal PreEn. The first pulse signal ActClk and the second pulse signal PreClk are stagger pulse signals, and the stagger pulse signals are the pulse signal (the first pulse signal ActClk and the second pulse signal PreClk) generated according to the inverted signals (the first control signal ActEn and the second control signal PreEn).

Referring to FIG. 10, the stagger pulse generation circuit 300 is configured to receive an external input activation signal Active, the signal generation circuit 303 is configured to generate a first control signal ActEn and a second control signal PreEn according to the externally input activation signal Active, and the first control signal ActEn and the second control signal PreEn are inverted signals.

Specifically, referring to FIG. 12, when the activation signal Active is at the active level, the generated first control signal ActEn is at the active level. The first pulse generation cell 301 is configured to generate the first oscillation signal Osc1 with a period of T and the second oscillation signal Osc2 with a period of 2T according to the first control signal ActEn; and in this embodiment, the period of the second oscillation signal Osc2 is consistent with the period of the first oscillation signal Osc1, and the first pulse signal ActClk is generated according to the rising edge of the second oscillation signal Osc2. The second pulse generation cell 302 is configured to generate a first oscillation signal Osc1" with a period of T and a second oscillation signal Osc2" with a period of 2T according to the second control signal PreEn; and in this embodiment, the period of the second oscillation signal Osc2" is consistent with the period of the first oscillation signal Osc1", and the second pulse signal PreClk is generated based on the rising edge of the second oscillation signal Osc2". The first pulse signal ActClk and the second pulse signal PreClk generated at this time are stagger pulse signals.

Compared with the related art, the first control signal and the second control signal are generated according to the activation signal, the first control signal and the second control signal are mutually inverted signals; the first pulse signal and the second pulse signal generated according to the inverted control signal are stagger pulse signals, that is, when the first pulse signal is in the pulse period, the second pulse signal is at an inactive level; when the second pulse signal is in the pulse period, the first pulse signal is at an inactive level, and the periods of the generated first pulse signal and the second pulse signal can be adjusted, that is, a pulse signal with an adjustable period is generated, and meanwhile, the circuit involves fewer devices, the area of the circuit layout is small, and the power consumption of the circuit is low.

It is worth mentioning that each cell involved in this embodiment is a logical cell. In practical applications, a logical cell can be a physical cell, a part of a physical cell, or can also be achieved as a combination of multiple physical cells. In addition, in order to highlight the innovative part of this disclosure, this embodiment does not introduce cells that are not closely related to solving the technical problem proposed by this disclosure, but this does not indicate that there are no other cells in this embodiment.

Since the above embodiment and this embodiment correspond to each other, this embodiment can be implemented in cooperation with the above embodiment. The relevant technical details mentioned in the above embodiment are still valid in this embodiment, and the technical effects that can be achieved in the above embodiment can also be achieved in this embodiment. In order to reduce repetition, details are not repeated here. Correspondingly, the related technical details mentioned in this embodiment can also be applied to the above embodiment.

Those skilled in the art can understand that the above embodiments are specific embodiments for achieving this application, and in actual applications, various changes can be made in form and details without departing from the spirit and spirit of this application.

INDUSTRIAL APPLICABILITY

In embodiments of this disclosure, the pulse generation circuit includes: an oscillation circuit, a period adjustment circuit and a pulse conversion circuit. The oscillation circuit receives a control signal and generates a first oscillation signal according to the control signal. The period adjustment circuit receives the first oscillation signal and a magnification selection signal, and outputs a second oscillation signal, herein the period of the second oscillation signal is a period of the first oscillation signal or a period of an oscillation adjustment signal, and the second oscillation signal is selected according to the magnification selection signal. The pulse conversion circuit receives the second oscillation signal and outputs a pulse signal, herein the pulse of the pulse signal is generated according to the rising edge or the falling edge of the second oscillation signal, and the pulse period of the pulse signal is the same as the oscillation period of the second oscillation signal. In this way, in the embodiments of this disclosure, a pulse signal with adjustable period is generated, and the area of the circuit layout is small, and the power consumption of the circuit is small.

The invention claimed is:

1. A pulse generation circuit, comprising:
   an oscillation circuit, configured to receive a control signal, and to generate a first oscillation signal according to the control signal;
   a period adjustment circuit, configured to receive the first oscillation signal and a magnification selection signal, and to output a second oscillation signal, wherein a period of the second oscillation signal is a period of the first oscillation signal or a period of an oscillation adjustment signal, and the second oscillation signal is selected according to the magnification selection signal; and
   a pulse conversion circuit, configured to receive the second oscillation signal and to output a pulse signal, wherein a pulse of the pulse signal is generated according to a rising edge or a falling edge of the second oscillation signal, and a pulse period of the pulse signal and the period of the second oscillation signal are identical,
   wherein the period adjustment circuit comprises:
      a delay cell, configured to receive the first oscillation signal and to generate the oscillation adjustment signal according to the first oscillation signal, wherein the period of the oscillation adjustment signal is different from the period of the first oscillation signal; and
      a selection cell, configured to receive the magnification selection signal, and to select the first oscillation signal or the oscillation adjustment signal as the second oscillation signal according to the magnification selection signal.

2. The pulse generation circuit according to claim 1, wherein the delay cell comprises a D flip-flop, and the D flip-flop comprises an input terminal, a clock terminal, a reset terminal, and an output terminal, and wherein the clock terminal is configured to receive the first oscillation signal, the reset terminal is configured to receive a reset signal, and the output terminal is configured to trigger inverters in series and connected to the input terminal, and is configured to output the oscillation adjustment signal.

3. The pulse generation circuit according to claim 1, wherein the selection cell comprises a magnification selector, and the magnification selector comprises a first selection input terminal, a second selection input terminal, a selection signal terminal, and a selection output terminal, and wherein the first selection input terminal is configured to receive the first oscillation signal, the second selection input terminal is configured to receive the oscillation adjustment signal, the selection signal terminal is configured to receive the magnification selection signal, and the selection output terminal is configured to output the second oscillation signal.

4. The pulse generation circuit according to claim 1, wherein the delay cell comprises E delay sub-cells connected in series, the oscillation adjustment signal comprises E delay signals, wherein the E is a positive integer;
   a first level delay sub-cell, configured to generate a first delay signal according to the first oscillation signal, and to input the first delay signal into a second level delay sub-cell; and
   an F-th level delay sub-cell, configured to generate an F-th delay signal according to an (F−1)-th delay signal, wherein the F is a positive integer greater than or equal to 2 and less than or equal to the E.

5. The pulse generating circuit according to claim 4, wherein the selection cell is specific configured to: select an (E−1)-th delay signal or an E-th delay signal as the second oscillation signal according to the magnification selection signal.

6. The pulse generation circuit according to claim 4, wherein the F-th level delay sub-cell comprises a D flip-flop, and the D flip-flop comprises an input terminal, a clock terminal, a reset terminal, and an output terminal, and wherein the clock terminal is configured to receive the (F−1)-th delay signal, the reset terminal is configured to receive a reset signal, and the output terminal is configured to trigger inverters in series and connected to the input terminal, and is configured to output the F-th delay signal.

7. The pulse generation circuit according to claim 4, wherein the selection cell comprises E selection sub-cells connected in series, and the magnification selection signal comprises a sub-magnification selection signal corresponding to each of the E selection sub-cells;
   a first level selection sub-cell, configured to select the first oscillation signal or the first delay signal to input into a second level selection sub-cell according to a corresponding sub-magnification selection signal;
   an F-th level selection sub-cell, configured to select an output signal of an (F−1)-th level selection sub-cell or the F-th delay signal to input into an (F+1)-th level selection sub-cell according to a corresponding sub-magnification selection signal; and
   an E-level selection sub-cell, configured to select an output signal of an (E−1)-th level selection sub-cell or the oscillation adjustment signal as the second oscillation signal according to a corresponding sub-magnification selection signal, wherein the F is a positive integer greater than or equal to 2 and less than the E.

8. The pulse generation circuit according to claim 7, wherein the F-th level selection sub-cell comprises a magnification selector and the magnification selector comprises a first selection input terminal, a second selection input terminal, a selection signal terminal, and a selection output terminal, and wherein the first selection input terminal is configured to receive the output signal of the (F−1)-th level selection sub-cell, the second selection input terminal is configured to receive the F-th delay signal, the selection signal terminal is configured to receive the corresponding sub-magnification selection signal, and the selection output terminal is configured to output the output signal of the (F−1)-th level selection sub-cell or the F-th delay signal.

9. The pulse generation circuit according to claim 1, wherein the oscillation circuit comprises:
   an oscillation cell and a trigger cell connected to the oscillation cell;
   the trigger cell is configured to receive a reset signal and the control signal, and trigger the oscillation cell according to the reset signal and the control signal;
   after the oscillation cell is triggered, the first oscillation signal is generated according to the control signal.

10. The pulse generation circuit according to claim 9, wherein the oscillation cell comprises a ring oscillator formed by A inverters connected in series, and the A is a positive odd number.

11. The pulse generation circuit according to claim 10, wherein the trigger cell comprises:
    a first NAND gate and a second NAND gate, wherein an output terminal of the first NAND gate is connected to an input terminal of the second NAND gate;
    an input terminal of the first NAND gate and an output terminal of the second NAND gate are configured to connect to the ring oscillator;
    one of the first NAND gate and the second NAND gate is configured to receive the control signal, and another one of the first NAND gate and the second NAND gate is configured to receive the reset signal.

12. The pulse generation circuit according to claim 11, wherein the oscillation circuit further comprises:
    a first inverter group, comprising B inverters connected in series, wherein B is a positive even number; and
    a first selection cell, configured to receive a first selection signal, and connect the first inverter group in series between adjacent inverters in the ring oscillator according to the first selection signal.

13. The pulse generation circuit according to claim 12, wherein the oscillation circuit further comprises:
    a second inverter group, comprising C inverters connected in series, wherein C is a positive even number; and
    a second selection cell, configured to receive a second selection signal, and connect the second inverter group in series between the adjacent inverters in the ring oscillator according to the second selection signal.

14. A stagger pulse generation circuit, comprising:
    a signal generation circuit, configured to generate a first control signal and a second control signal according to an activation signal, wherein the first control signal and the second control signal are inverted signals;
    a first pulse generation cell, comprising a first pulse generation circuit, wherein the first pulse generation cell is configured to generate a first pulse signal according to the first control signal; and
    a second pulse generation cell, comprising a second pulse generation circuit, wherein the second pulse generation cell is configured to generate a second pulse signal according to the second control signal,
    wherein the first pulse signal and the second pulse signal are staggered pulse signals,
    wherein the first pulse generation circuit comprises:
       a first oscillation circuit, configured to receive the first control signal, and to generate a first oscillation signal according to the first control signal;
       a first period adjustment circuit, configured to receive the first oscillation signal and a first magnification selection signal, and to output a second oscillation signal, wherein a period of the second oscillation signal is a period of the first oscillation signal or a period of a first oscillation adjustment signal, and the second oscillation signal is selected according to the first magnification selection signal; and
       a first pulse conversion circuit, configured to receive the second oscillation signal and to output the first pulse signal, wherein a pulse of the first pulse signal is generated according to a rising edge or a falling edge of the second oscillation signal, and a pulse period of the first pulse signal and the period of the second oscillation signal are identical, and
    wherein the second pulse generation circuit comprises:
       a second oscillation circuit, configured to receive the second control signal, and to generate a third oscillation signal according to the second control signal;
       a second period adjustment circuit, configured to receive the third oscillation signal and a second magnification selection signal, and to output a fourth oscillation signal, wherein a period of the fourth oscillation signal is a period of the third oscillation signal or a period of a second oscillation adjustment signal, and the fourth oscillation signal is selected according to the second magnification selection signal; and
       a second pulse conversion circuit, configured to receive the fourth oscillation signal and to output the second pulse signal, wherein a pulse of the second pulse signal is generated according to a rising edge or a falling edge of the fourth oscillation signal, and a pulse period of the second pulse signal and the period of the fourth oscillation signal are identical.

15. The stagger pulse generation circuit according to claim 14, wherein the signal generation circuit comprises:
    a reset cell, configured to receive a first reset signal and the activation signal, and to generate the first control signal according to the first reset signal and the activation signal; and
    a reverse cell, configured to receive the first control signal, and to generate the second control signal according to the first control signal.

16. The stagger pulse generation circuit according to claim 15, wherein the reset cell comprises a reset NAND gate and a reset inverter, the reset inverter is connected to an output terminal of the reset NAND gate, and the reset NAND gate is configured to receive the first reset signal and the activation signal.

17. The stagger pulse generation circuit according to claim 15, wherein the signal generation circuit further comprises: a reset signal generation cell configured to generate a second reset signal according to the first reset signal and the first control signal, wherein the second reset signal is in a reset state when the first reset signal is in the reset state, or the second reset signal with a reset narrow pulse is generated according to a changing edge of the first control signal when the first reset signal is in a non-reset state.

18. The stagger pulse generation circuit according to claim 14, wherein the signal generation circuit further comprises: a selection signal generation cell configured to receive a selection signal and generate a selection signal group according to the selection signal; and
    the selection signal group comprises the selection signal and an inverted selection signal, and the selection signal and the inverted selection signal are inverted signals.

19. A pulse generation circuit, comprising:

an oscillation circuit, configured to receive a control signal, and to generate a first oscillation signal according to the control signal;

a period adjustment circuit, configured to receive the first oscillation signal and a magnification selection signal, and to output a second oscillation signal, wherein a period of the second oscillation signal is a period of the first oscillation signal or a period of an oscillation adjustment signal, and the second oscillation signal is selected according to the magnification selection signal; and a pulse conversion circuit, configured to receive the second oscillation signal and to output a pulse signal, wherein a pulse of the pulse signal is generated according to a rising edge or a falling edge of the second oscillation signal, and a pulse period of the pulse signal and the period of the second oscillation signal are identical, wherein the oscillation circuit comprises:

an oscillation cell and a trigger cell connected to the oscillation cell;

the trigger cell is configured to receive a reset signal and the control signal, and trigger the oscillation cell according to the reset signal and the control signal;

after the oscillation cell is triggered, the first oscillation signal is generated according to the control signal.

20. The pulse generation circuit according to claim 1, wherein the pulse conversion circuit comprises a pulse converter configured to receive the second oscillation signal and to generate the pulse signal according to the second oscillation signal.

\* \* \* \* \*